United States Patent [19]

Nirschl

[11] Patent Number: 4,773,064
[45] Date of Patent: Sep. 20, 1988

[54] APPARATUS FOR STATUS CHANGE RECOGNITION IN A MULTIPLEX CHANNEL

[75] Inventor: Heinrich Nirschl, Munich, Fed. Rep. of Germany

[73] Assignee: Siemens Aktiengesellschaft, Berlin & Munich, Fed. Rep. of Germany

[21] Appl. No.: 879,457

[22] Filed: Jun. 27, 1986

[30] Foreign Application Priority Data

Jun. 27, 1985 [DE] Fed. Rep. of Germany ....... 3523037

[51] Int. Cl.⁴ ............................. H04J 1/16; H04J 3/14
[52] U.S. Cl. ................................... 370/13; 370/110.1; 371/69
[58] Field of Search ............... 370/13, 110.1; 307/517, 307/234; 328/108, 109; 371/69

[56] References Cited

U.S. PATENT DOCUMENTS

| | | | |
|---|---|---|---|
| 3,473,130 | 10/1969 | Briggs | 328/109 |
| 3,550,017 | 12/1970 | Whalen | 328/110 |
| 3,842,399 | 10/1974 | Knever et al. | 371/69 |
| 3,862,440 | 1/1975 | Suzuki et al. | |
| 3,873,776 | 3/1975 | Smith, Jr. et al. | 370/110.1 |

Primary Examiner—Douglas W. Olms
Assistant Examiner—Wellington Chin
Attorney, Agent, or Firm—Hill, Van Santen, Steadman & Simpson

[57] ABSTRACT

Apparatus for recognizing a logical status change between two values in a channel of an n-bit multiplex signal, incorporates an n-bit shift register controlled by the multiplex clock, and an AND gate connected to receive said input multiplex signal and an output of said shift register, with an inverter in series with one of the inputs of the AND gate. The AND gate produces a signal corresponding to a status change in a channel of the n-bit multiplex signal between two successive frames. A D-type flip-flop synchronizes the output of the AND gate with the multiplex clock.

7 Claims, 3 Drawing Sheets

APPARATUS FOR STATUS CHANGE RECOGNITION IN A MULTIPLEX CHANNEL

BACKGROUND

The present invention relates to an apparatus for recognizing a logical status change in one or more channels of an n-bit multiplex signal, especially in signaling (DS) devices.

As described in "Pflichtenheft fuer Fehler und Stoerungssignalisierung fuer PCM- und DS-Geraete" of the German Federal Mails, Central Telecommunications Office, Department N12, FTZ 153 Pfl..., Second Edition, several important functions of a system are monitored with the assistance of special monitoring circuits incorporated in the system devices. When such a monitoring circuit indicates an error or other condition, then an indicator in the form of a LED is lit in the device recognizing the error, and an error report is transmitted. Generally, error reports of a plurality of devices are grouped together, and the error reports of such devices are connected onto common lines.

The levels of significance of an error alarm is distinguished on the basis of priority, or the urgency of the error type. An A type error or urgent alarm, must be immediately handled, even outside of regular working hours, for example during nights and holidays. A B type or non-urgent alarm can be handled during regular working hours. At the individual devices, the error reports are switched on to different signal lines by means of switching bridges. As long as the error condition remains, the LED is lit in the device, and a grounded potential is applied to the signal line AZ (for type A-alarms) or BZ (for type B-alarms). The begining of the error condition is also reported by sending a pulse onto a signal line A or B, which results in the excitation of an alarm lamp A or B. The alarm condition is also forwarded via alarm lines to another indicator device and an alarm lamp A or B is also illuminated there.

The alarm report can be disconnected by manually pressing an acknowledgment key. This causes a reminder alarm lamp EL in the signal field, and in the light display means, to be lit, instead of the alarm lamps A or B. The reminder alarm lamp EL can also light up when a switch or plug in the device is not in its operational condition.

The alarm outputs A and B, and the reminder lamps EL, of a given group of error reports and the alarm outputs of all light display means are combined to form a single collective error signal. This collective error signal is then forwarded to a central place of operational supervision, and signifies only that some system part in an operating location has produced an error report. The reminder lamp in the signal field and the light display means are: lluminated as long as an error report is being produced from a device, so that one of the status lines AZ or BZ remains grounded as long as the error report continues. In addition, as long as the switch or plug is not in its operational condition the reminder lamp EL also remains energized.

In multiplex devices, it is desirable that each input be able to produce a new error report independently of the other inputs for an error report, for example, the disconnection of an normal input signal, even when there is already an error report of an input which has been acknowledged. That is, a pulse must be produced on the bus line A or B whenever another error occurs, even when the status line (AZ or BZ) is still activated.

In a previously proposed system, an input of an OR gate is provided for connection to receive error reports from each channel, and the output of this OR gate is directly connected to the signal line AZ or BZ, and through a pulse shaper to the signal line A or B. While this results in a reporting of the first error to occur, subsequent errors are hidden by the operated condition of the OR gate.

BRIEF DESCRIPTION OF THE INVENTION

A principle object of the present invention is to provide a simple arrangement for the recognition of a logical status change either from a low value to a high value, or vice versa, in a channel of an n-bit multiplex signal.

This object is achieved in the present invention by using an n-bit shift register having its data input connected to receive the multiplex signals and its clock input connected to a source of bit clock pulses synchronized with the multiplex signal. An AND gate is provided, having one input connected to receive the multiplex signal and another input connected to an output of the n-bit shift register to produce a signal indicating a status change from a high value to a low value, or a low value to a high value, in a given multiplex channel, and including a D-type flip-flop having its data input connected to the output of the AND gate, and its clock input connected to the source of bit clock pulses.

An indication of a status change from low to high, or alternatively from high to low, is thereby produced by the system independently of the status of all other bits in the multiplex signal.

The present invention is advantageously employed in error signaling for PCM (pulse code modulation) and DS digital signal devices, as well as digital signal channel distributors, because the necessary functions in connection with error reports can be achieved in a simple and effective way.

BRIEF DESCRIPTION OF THE DRAWINGS

Reference will now be made to the accompanying drawings in which.

DESCRIPTION OF THE PREFERRED EMBODIMENTS

Figure 1:
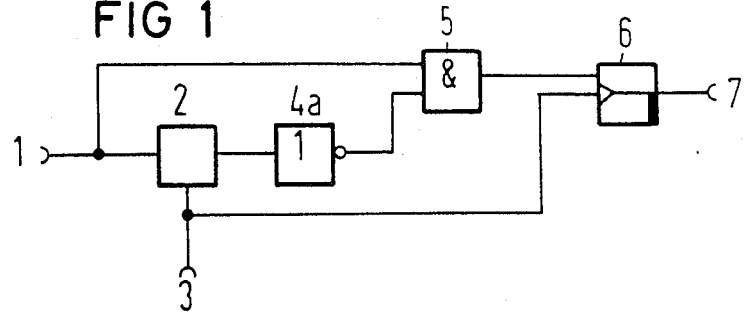
FIG. 1 is a functional block diagram of an arrangement for the recognizing a logical status change from a low value to a high value in a channel of an n-bit multiplex signal.

FIG. 1 shows an apparatus for recognizing the logical status change from a low value to a high value in a channel of an n-bit multiplex signal. The multiplex signal is applied to an input 1, and is connected to the data input of an n-bit shift register 2, which receives bit clock pulses from the clock signal generator connected to a terminal 3. An inverter 4a is connected to an output of the shift register 2, and an AND gate 5 has its two inputs connected directly to the input terminal 1, and to the output of the inverter 4a. The output of the AND gate 5 is connected to the data input of a D-type flip-flop 6, the clock input of which is connected to the terminal 3.

The n-bit multiplex signal comprises a serial stream or frames of multiplex time slots, corresponding to n-channels, which frames repeat at a periodic rate so that a given channel is found always at the same bit location in a frame. The length of the shift register 2 corresponds to the number of channels in each frame, so that a signal emitted from the output of the shift register 2 corresponds to a bit in the same channel, during the previous frame, as the bit currently arriving at the input terminal 1. Thus, the bits supplied as inputs to the AND gate 5 correspond to bits of the same channel in two successive frames. When the new bit has a logioal status of a high value and the earlier bit has a logical status of a low value, then the output of the AND gate 5 goes high, which places the high value at the D-input of the D-type flip-flop 6. The flip-flop 6 produces a high level at the output terminal 7 in synchronism with the next clock pulse, to indicate transistion of a low value to a high value for particular channel of the multiplex signal. The output of the flip-flop 6 for the following clock period, corresponding to the succeeding channel, is low unless there is also a transistion of a low status to a high status occuring in that succeeding channel in the same two successive pulse frames.

Figure 2:
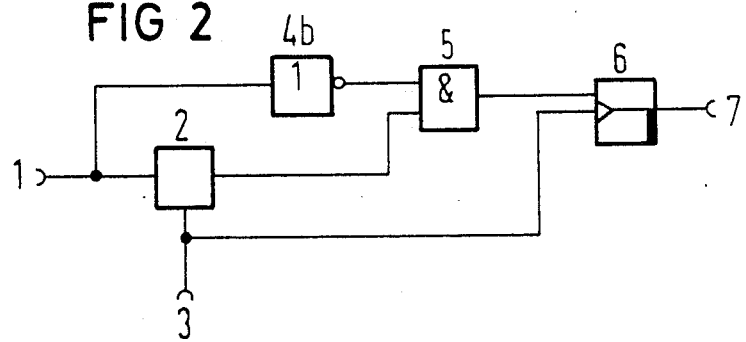
FIG. 2 is a functional block diagram of an arrangement for the recognizing a logical status change from a high value to a low value in a channel of an n-bit multiplex signal.

FIG. 2 shows an arrangement for recognizing a logical status change from a high to a low value in a channel of an n-bit multiplex system. The arrangement of FIG. 2 differs from that of FIG. 1 only in that the inverter 4b in connected in series with the other input of the AND gate. The circuit of FIG. 2 functions to produce a high level at the output of terminal 7 of the D-type flip-flop 6, for one clock period, when the logical level of the multiplex channel associated with that clock period changes from high to low during two successive frames.

Figure 3:
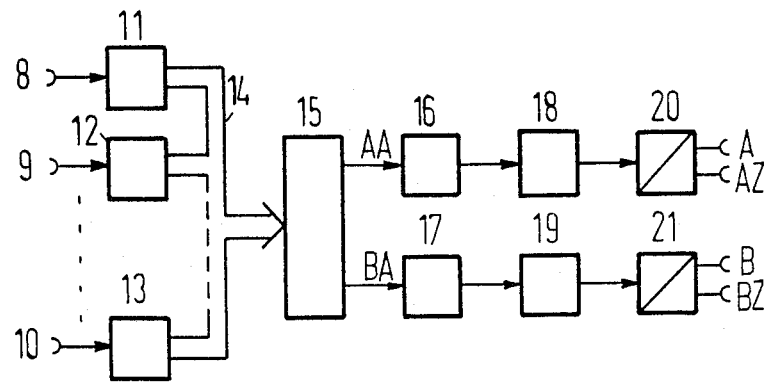
FIG. 3 is a functional block diagram of a monitoring circuit of a digital signal channel distributor incorporating the present invention.

FIG. 3 shows a monitoring device incorporating the present invention. It includes error recognition recognizing errors in the operation of various operational devices connected to their inputs 8–10. The units 11–13 are each connected by an alarm bus 14 to a logic unit 15 which is adapted to emit either an A-type alarm AA or a B-type alarm BA. The A-type alarm AA is connected to the input of a time-evaluation device 16 the output of which is connected to the input of a status change recognition unit 18 The output of the recognition device 18 is connected to the input of a converter 20 which produces an alarm pulse on a signal line A and a continuous alarm signal on a signal line AZ. Correspondingly, a B-type alarm BA is connected to a time-evaluation device 17, the recognition unit 19, which produces an output connected signal line B and a continuous alarm signal on a signal integrated module type PEB 030 marketed by the Siemens Company.

The monitoring system of FIG. 3 is capable of meeting the requirements of the German Federal Mails. The error and malfunction recognition devices 11–13 recognize errors at the terminals 8–10 and emit error reports in the form of multiplex signals to the logic forwarded to the time-evaluation devices 16 and 17 either as urgent alarms AA or as non-urgent alarms BA, in the form of multiplex signals, so that each channel of the n-channel multiplex signal may receive a separate error signal. The recognition units 18 and 19 develop output signals upon recognizing a change in status of the given channel of the multiplex signal, after a delay of 150 ms through 600 ms, which delay results from operation of the time-evaluation devices 16 and 17, and the outputs of the recognition units 18 and 19 are forwarded in the form of multiplex signals. The converters 20 and 21 produce pulses (on signal lines A or B) at the begining of an error condition and continuous signals (on the signal lines AZ and BZ), which pulses and signals are recognized at a central place of operations as an error of a given type associated with a unit connected to one of the specific inputs 8–10.

Figure 4:
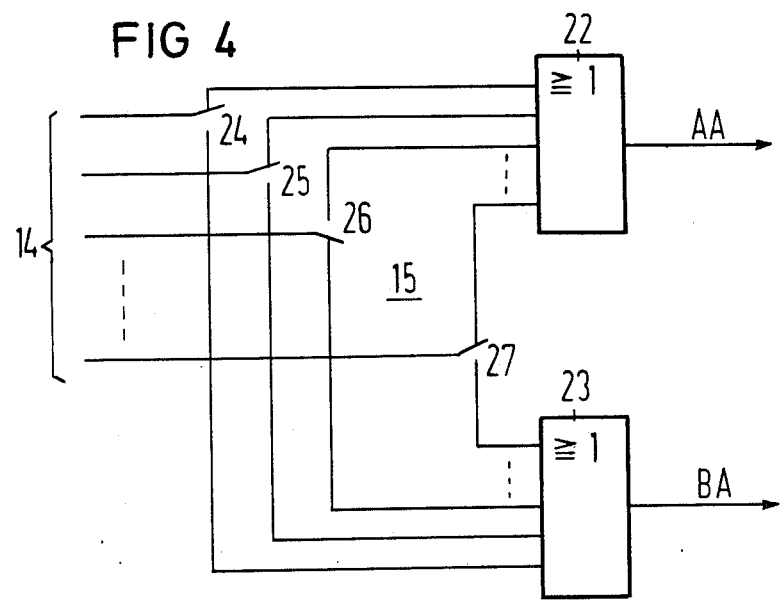
FIG. 4 is a schematic circuit diagram of logic means incorporated in FIG. 3.

FIG. 4 shows a schematic circuit diagram of the logic unit 15 of FIG. 3. It contains OR gates 22 and 23, as well as a plurality of switches 24–27. The alarm bus 14 has individual lines for the various error conditions produced by the recognition units 11–13, and these are connected through the switches 24–27 to an input of one or the other of the OR gates 22 and 23, depending on whether the given line is associated with an urgent error or an non-urgent error condition. The switches 24–27 allow the type of error to be manually selected for each of the lines of the input bus 14. The OR gate 22 produces an urgent error signal AA when any of the lines of the bus 14 have an error signal connected through a switch 24–27 to one of the inputs of this OR gate. Similarly, the OR gate 23 produces an output signal when any of its inputs receive a signal from a line of the bus 14.

The error-indicating signals on the lines of the bus 14 appear at times corresponding to the time slots associated with various channels of an n-channel (or n-bit) multiplex signal, so that only one of the lines of the bus 14 manifests an error condition at any one time. Alternatively, two or more of the lines of the bus 14 may be active simultaneously when it is not necessary to distinguish between error conditions occuring in the devices to which such lines are connected. Thus, the outputs from the OR gates 22 and 23 each comprise a stream of pulses, corresponding to successive multiplex frames, having bits at positions corresponding to the active lines of the bus 14.

Figure 5:
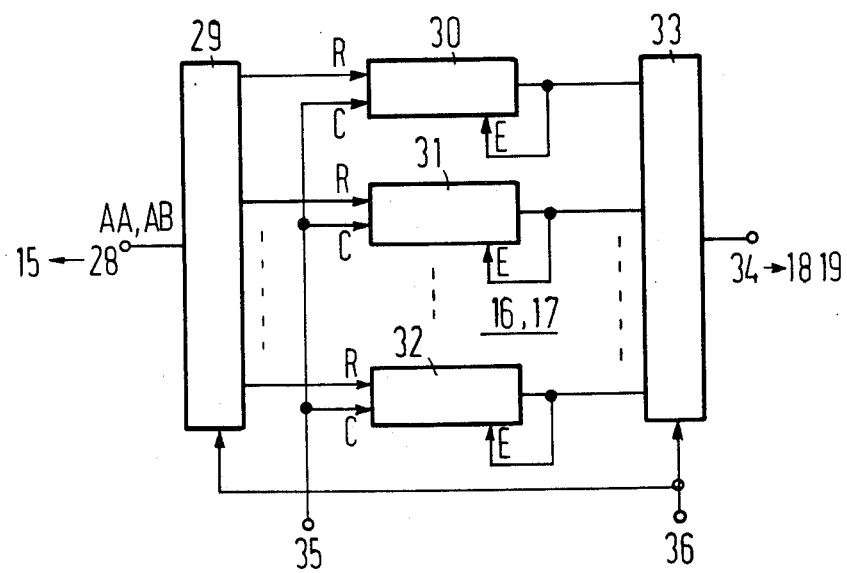
FIG. 5 is a schematic circuit diagram of time evaluating apparatus included in FIG. 3.

FIG. 5 shows details of the time-evaluation device 16 or 17 of FIG. 3. An input 28 is connected to an output of the logic unit 15 to receive either the AA multiplex signal or the BA multiplex signal. The input 28 is connected to the data input of an n-bit demultiplexer 29 which connects the terminal 28 to one of a plurality of output terminals, each of which is connected to the active-low reset input of one of a plurality of counters 30–32. The output of the demultiplexer 29 is selected by signal on an address bus connected to the demultiplexer 29 through a terminal 36. The address bus supplies, repetitively and sequentially to the demultiplexer 29, n different addresses corresponding to the n outputs of the demultiplexer so that the multiplex signal supplied to the terminal 28 is demultiplexed, with each of the n-channels being supplied to a separate one of the counters 30–32. The source of bit clock pulses is applied to a terminal 35 and to the clock input of each of the counters 30–32. Each of the counters has an output which goes high when the counter has been counted up to its full radix, and each counter has a connection from its output to an enable input, which operates to disable the counter from further counting, When no error report is contained in the n-bit multiplex signal applied to the terminal 28, then all the counters 30-32 are periodically reset by the low level output signals of the demultiplexer unit 29. However, when one or more channels applied to the input terminal 28 contains an error signal, the reset for a an error condition occurs in the first channel, no signal is applied to the reset input of the counter so that after a number of bit olock pulses applied to terminal 35, corresponding to the radix of the counter 30, the counter manifests a continuous high output the absence of an error signal in its channel of the multiplex signal. This output signal is connected to an input of a multiplex unit 33, which receives its address input over a bus connected to the terminal 36. The multiplexer 33 connects the outputs of each of so that an n-channel multiplex signal is produced on at the counters 30-32 in turn to the output terminal 34, the terminal 34 having channel bits which signal error conditions in specific channels of the n-channel system, of a duration longer than the counting period of its respective counter.

Figure 6:
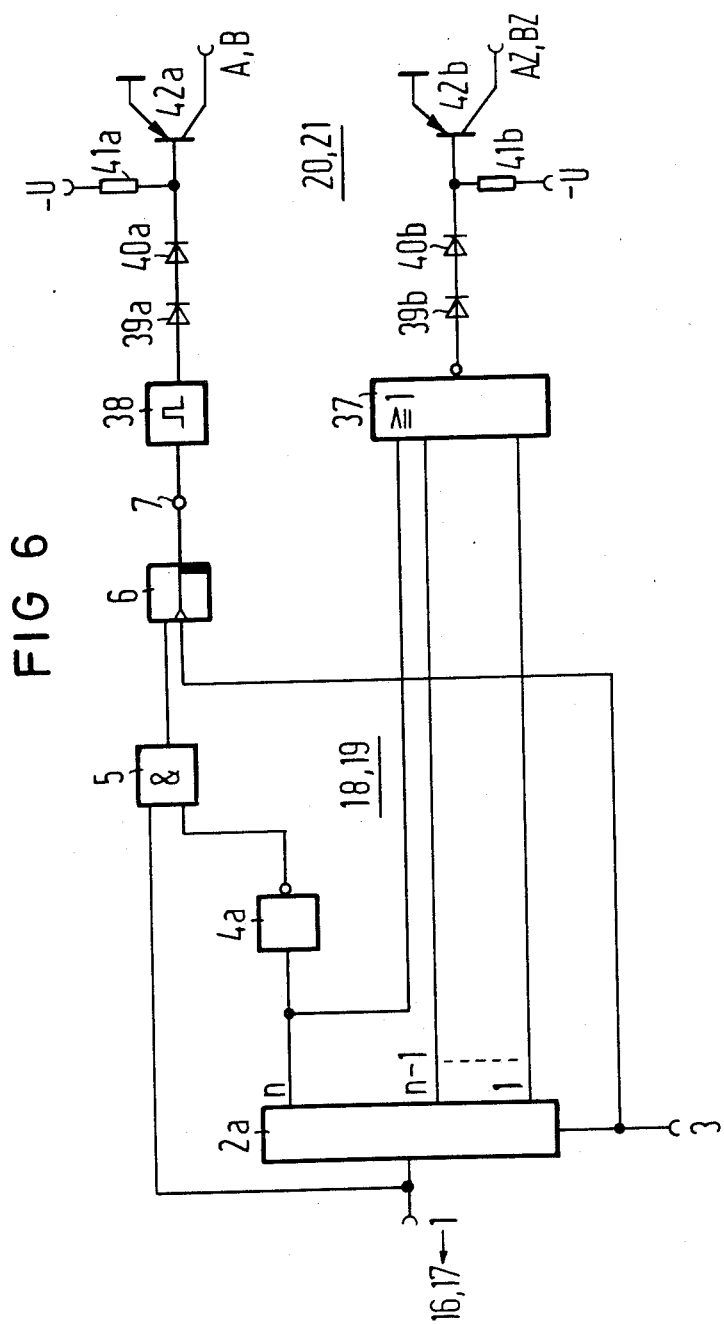
FIG. 6 is a schematic circuit diagram of a portion of the apparatus of FIG. 3.

FIG. 6 shows a schematic diagram of the remaining oomponents of FIG. 3. It incorporates a status recognition unit like that of FIG. 1, with common components having the same reference numerals. The n-bit shift register 2a is shown in greater detail in FIG. 6. The output 7 of the D-type flip-flop 6 is connected through a monostable flip-flop 38 and two diodes 39a and 40a to the base of a transistor 42a. The base is also oonneoted to a souroe of low potential through a resistor 41a. The transistor 42a is normally biased for conduction. Its collector is connected to the pulse output line A (for type A signals) or B (for type B signals). The monostable flip-flop 38 produces a short pulse in response to the begining of each output the D-type flip-flop 6, which pulse cuts off the transistor 42a for a short period of time, and manifests a short pulse on the pulse output line A or B.

The two inputs of the AND gate 5 are connected respectively to the date input of the shift register 2a, and to the nth output thereof (through the inverter 4a) so that the two inputs of the AND gate correspond to the same channel of the n-channel multiplex signal.

The n outputs of the shift register 2a are all connected to inputs of an NOR gate 37, the output of which is connected through two diodes 39b and 40b to the base of a transistor 42b. The base is also connected to a low bias potential through a resistor 41b. The transistor 42b is normally biased for conduction. Its collector is connected to the continuous output line AZ (for urgent signals) or BZ (for non-urgent signals). When any of the n-channels of the n-channel multiplex signal contain an error bit, the NOR gate 37 receives an input signal on one of its several input lines at all times, so that a continuous low signal is produced at its output, so that the transistor 42b can-maintain its conductive state. When there is no error condition present in the input multiplex signal, however, the output of the NOR gate transistor 42b cut-off. In this way, the output lines AZ and BZ receive continuous signals in accordance with whether there is an error or no error in the input multiplex signal.

It will be appreciated by others skilled in the art that various additions and modifications may be made in the apparatus of the present invention without departing from the essential features of novelty thereof, which are intended to be defined and secured by the appended claims.

What is claimed is:

1. Apparatus for recognizing a logical status change from a first value to a second value but not from said second value to said first value, in a channel of an n-channel multiplex signal comprising in combination; an n-bit shift register, means for connecting the data input of said shift register to a n-channel multiplex signal, means for connecting a source of clock pulses to the clock input of said shift register, and AND gate having a first input connected directly to said multiplex signal and a second input connected to an output of said shift register, an inverter connected in series with one of the inputs of said AND gate, and a D-type flip-flop having its data input connected to the output of said AND gate and its clock input connected to said source of clock pulses for producing a multiplex output signal corresponding to a logical level change in any change of said n-channel multiplex signal.

2. Apparatus according to claim 1, including means connected to the output of said D-type flip-flop for producing a pulse output with a predetermined duration, said pulse corresponding in time to an output signal from said D-type flip-flop in any channel of said n-bit multiplex signal.

3. Apparatus according to claim 2, including time-evaluation means including a counter having a predetermined radix, means for applying a source of clock pulses to the clock input of said counter, means for manifesting a continuous output signal when the counter reaches a predetermined state, means for selectively applying a reset signal to said counter in response to a detected error condition, and multiplex means connected between the output of said counter and the input of said shift register for developing an nchannel multiplex signal with the output of said counter forming data for one channel of said multiplex signal.

4. Apparatus according to claim 3, including a demultiplexer adapted to receive a n-channel multiplex signal, and to supply signals corresponding to each channel of said multiplex signal to one of a plurality of outputs, and means for connecting one of said outputs to the reset input of said counter.

5. Apparatus according to claim 4, including logic means comprising an OR gate, and a plurality of switches interconnected between inputs of said OR gate and a plurality of signal lines adapted to manifest error conditions, whereby said OR gate produces an output corresponding to an error condition manifested on any of said signal lines which are connected to inputs of said OR gate through closed ones of switches, and means for connecting the output of said OR gate to the input of said demultiplexer, whereby error signals are supplied to said demultiplexer corresponding to a said error condition only when said error signal is connected through one of said switches to an input of said OR gate.

6. Apparatus according to claim 5, including a second OR gate, each of said switches being adapted to selectively connect each of said error lines to an input of one or the other of said two OR gates, whereby said two OR gates each produce a composite signal corresponding to error signals on said signal lines in accordance with the connection of its respective switch to either said first or to said second OR gate, and means connected to the output of said second OR gate for manifesting an alarm condition in response to error signals supplied to said second OR gate through said switches.

7. Apparatus for monitoring a digital signal channel distributor having a plurality of fault recognition units for recognizing individual ones of a plurality of fault signals, logic means connected to the outputs of said fault recognition units, said logic means having two alarm output terminals, and means for manifesting, on one or the other of said alarm output terminals, signals corresponding to individual ones of said fault recognition units, a pair of time evaluation units, each connected to one of said alarm output terminals, each of said time evaluation units having an output, a pair of status recognition means, each connected to one of said time evaluation unit output, each of said status recognition means comprising an n-bit shift register, means for connecting the data input of said shift register to a n-channel multiplex signal, means for connecting a source of clock pulses to the clock input of said shift register, an AND gate having a first input connected directly to said n-channel multiplex signal and a second input connected to an output of said shift register, an inverter connected in series in one of the inputs of said AND gate, and a D-type flip-flop having its data input connected to the output of said AND gate and its clock input connected to said source of clock pulses for producing a multiplex output signal corresponding to a logical level change from a first level to a second level in any channel of said n-channel multiplex signal, and means connected to said status recognition means for manifesting two different output signals in response to whether said fault recognition signal is continuous or a non-continuous signal.

\* \* \* \* \*